United States Patent
Kim et al.

(10) Patent No.: US 9,253,871 B2
(45) Date of Patent: Feb. 2, 2016

(54) CIRCUIT CARD ASSEMBLY AND METHOD OF FABRICATING THE SAME

(71) Applicant: General Electric Company, Schenectady, NY (US)

(72) Inventors: Joo Han Kim, Niskayuna, NY (US); Hendrik Pieter Jacobus de Bock, Clifton Park, NY (US); Jay Todd Labhart, Cary, NC (US); Shakti Singh Chauhan, Guilderland, NY (US); Graham Charles Kirk, Milton Keynes (GB); Stuart Connolly, Northampton (GB)

(73) Assignee: General Electric Company, Niskayuna, NY (US)

( * ) Notice: Subject to any disclaimer, the term of this patent is extended or adjusted under 35 U.S.C. 154(b) by 229 days.

(21) Appl. No.: 14/068,697

(22) Filed: Oct. 31, 2013

(65) Prior Publication Data
US 2015/0116940 A1    Apr. 30, 2015

(51) Int. Cl.
*H05K 7/20* (2006.01)
*H01S 4/00* (2006.01)
(Continued)

(52) U.S. Cl.
CPC ............ *H05K 1/0203* (2013.01); *H05K 7/1461* (2013.01); *H05K 7/20672* (2013.01); *Y10T 29/49002* (2015.01)

(58) Field of Classification Search
CPC ... H01R 13/00; H05K 1/0203; H05K 7/1461; H05K 7/20; H05K 7/20672; F28F 7/00
USPC ......... 361/690, 700, 703; 29/592.1; 165/80.3, 165/104.33, 177, 185; 439/485; 174/15.2
See application file for complete search history.

(56) References Cited

U.S. PATENT DOCUMENTS

| | | | |
|---|---|---|---|
| 5,764,482 | A | 6/1998 | Meyer, IV et al. |
| 6,226,178 | B1 | 5/2001 | Broder et al. |

(Continued)

FOREIGN PATENT DOCUMENTS

| | | |
|---|---|---|
| EP | 0545563 B1 | 8/1995 |
| EP | 2466636 A2 | 6/2012 |

(Continued)

OTHER PUBLICATIONS http://www.google.com/imgres?imgurl=http://www.lulusoso.com/upload/20110825/Adjustable_screw_feet.jpg&imgrefurl=http://www.lulusoso.com/products/Adjustable-Feet.html&h=1092&w=942&sz=87&tbnid=jMZQw1VPIPeovM:&tbnh=88&tbnw=76&zoom=1&usg=_altZArdwsknOrdhMmxaVTc0mh3k=&hl=en&sa=X&ei=lWkWUuXFHe-n4AOBxlCgCg&ved=0CDYQ9QEwAA.

(Continued)

*Primary Examiner* — Courtney Smith
*Assistant Examiner* — Zhengfu Feng
(74) *Attorney, Agent, or Firm* — Nitin N. Joshi (57) ABSTRACT

A circuit card assembly is provided. The circuit card assembly includes a printed circuit board, at least one electronic component mounted on the printed circuit board, and a frame coupled to the printed circuit board such that the electronic component is disposed between the printed circuit board and the frame. The circuit card assembly also includes a heat transfer device coupled to the frame. The heat transfer device has a heat pipe disposed at least in part between the frame and the printed circuit board. The circuit card assembly further includes a pivotable brace biasing the heat pipe toward the electronic component to facilitate cooling the electronic component.

18 Claims, 5 Drawing Sheets

(51) Int. Cl.
*F28F 7/00* (2006.01)
*F28D 15/00* (2006.01)
*H01R 13/00* (2006.01)
*H05K 1/02* (2006.01)
*H05K 7/14* (2006.01)

(56) References Cited

U.S. PATENT DOCUMENTS

| | | | |
|---|---|---|---|
| 6,839,235 | B2 | 1/2005 | St. Louis et al. |
| 7,679,916 | B2 | 3/2010 | Orr et al. |
| 7,800,908 | B2 | 9/2010 | Schulz-Harder et al. |
| 7,936,560 | B2 | 5/2011 | Toyoda et al. |
| 7,974,090 | B2 | 7/2011 | Risher-Kelly |
| 8,223,494 | B2 | 7/2012 | Bult |
| 8,482,920 | B2 | 7/2013 | Tissot et al. |
| 2004/0132331 | A1* | 7/2004 | Osborn et al. ............ 439/485 |
| 2008/0247137 | A1 | 10/2008 | Dautert et al. |
| 2009/0279251 | A1* | 11/2009 | Liu et al. .................. 361/690 |
| 2012/0125586 | A1 | 5/2012 | Chen et al. |

FOREIGN PATENT DOCUMENTS

| | | |
|---|---|---|
| WO | 0120675 A1 | 3/2001 |
| WO | 2011083052 A1 | 7/2011 |

OTHER PUBLICATIONS http://www.fujipoly.com/products/sarcon-thermal-management-components/88.html.

European Search Report and Opinion issued in connection with corresponding EP Application No. 14190939.0 on Mar. 5, 2015.

* cited by examiner

CIRCUIT CARD ASSEMBLY AND METHOD OF FABRICATING THE SAME

BACKGROUND

The subject matter described herein relates generally to an electronics system and, more particularly, to a circuit card assembly of an electronics system.

Most modern electronics systems function using at least one circuit card assembly. Many known circuit card assemblies include a printed circuit board on which at least one chip (or other electronic component) is mounted. Because the chips are typically soldered to the printed circuit board, the resulting height (and levelness) of each chip on the printed circuit board is permitted to vary within predefined manufacturing tolerances that account for variations in solder thickness and other assembly-related variables.

Moreover, the various chips of a circuit card assembly generate heat during operation of the electronics system, and it is desirable to actively cool the chips in order to keep them functioning properly. In that regard, the chips of at least some circuit card assemblies are conduction-cooled using cooling structures that physically contact the chips to transfer heat away from the chips. However, the possible variance in the height (and levelness) of the chips on the printed circuit board has been known to result in less than desirable contact between the cooling structures and their respective chips, thereby resulting in a less than desirable cooling effect.

BRIEF DESCRIPTION

In one aspect, a circuit card assembly is provided. The circuit card assembly includes a printed circuit board, at least one electronic component mounted on the printed circuit board, and a frame coupled to the printed circuit board such that the electronic component is disposed between the printed circuit board and the frame. The circuit card assembly also includes a heat transfer device coupled to the frame. The heat transfer device has a heat pipe disposed at least in part between the frame and the printed circuit board. The circuit card assembly further includes a pivotable brace biasing the heat pipe toward the electronic component to facilitate cooling the electronic component.

In another aspect, a method of fabricating a circuit card assembly is provided. The method includes providing a printed circuit board having at least one electronic component mounted on the printed circuit board, and coupling the printed circuit board to a frame such that the electronic component is disposed between the printed circuit board and the frame. The method also includes coupling a heat transfer device to the frame such that a heat pipe of the heat transfer device is disposed at least in part between the frame and the printed circuit board. The method further includes biasing the heat pipe toward the electronic component using a pivotable brace to facilitate cooling the electronic component.

In another aspect, an electronics system is provided. The electronics system includes a chassis and a circuit card assembly mounted on the chassis. The circuit card assembly includes a printed circuit board, at least one electronic component mounted on the printed circuit board, and a frame coupled to the printed circuit board such that the electronic component is disposed between the printed circuit board and the frame. The circuit card assembly also includes a heat transfer device coupled to the frame. The heat transfer device has a heat pipe disposed at least in part between the frame and the printed circuit board. The circuit card assembly further includes a pivotable brace biasing the heat pipe toward the electronic component to facilitate cooling the electronic component by transferring heat generated by the electronic component to the chassis using the heat pipe.

DRAWINGS

These and other features, aspects, and advantages of the present disclosure will become better understood when the following detailed description is read with reference to the accompanying drawings in which like characters represent like parts throughout the drawings, wherein.

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about" and "substantially", are not to be limited to the precise value specified. In at least some instances, the approximating language may correspond to the precision of an instrument for measuring the value. Here and throughout the specification and claims, range limitations may be combined and/or interchanged. Such ranges are identified and include all the sub-ranges contained therein unless context or language indicates otherwise.

The embodiments disclosed herein facilitate providing a brace and a heat transfer device that account for manufacturing tolerances and other variables associated with fabricating a circuit card assembly. The embodiments further facilitate reducing inconsistencies (such as gaps) in the contact between an electronic component of a circuit card assembly and the heat transfer device dedicated to cooling the electronic component. The devices, systems, and methods disclosed herein also facilitate providing a system configured to automatically adjust the contact between an electronic component disposed on a printed circuit board and a heat transfer device dedicated to cooling the electronic component. The devices, systems, and methods further facilitate providing a cooling system having a self-adjustable brace configured to supply a biasing force that slightly deforms an annealed copper heat pipe to enable the heat pipe to make better contact with the electronic component for which the heat pipe is to provide cooling. Additionally, the embodiments disclosed herein facilitate reducing thermal resistance in a processor of a circuit card assembly so as to mitigate the temperature increase of the processor during operation, thereby increasing processor power. The embodiments also facilitate enabling an avionics system to function more effectively in military environments having extreme temperature gradients and high shock/vibration, thereby improving the reliability of the avionics system.

Figure 1:
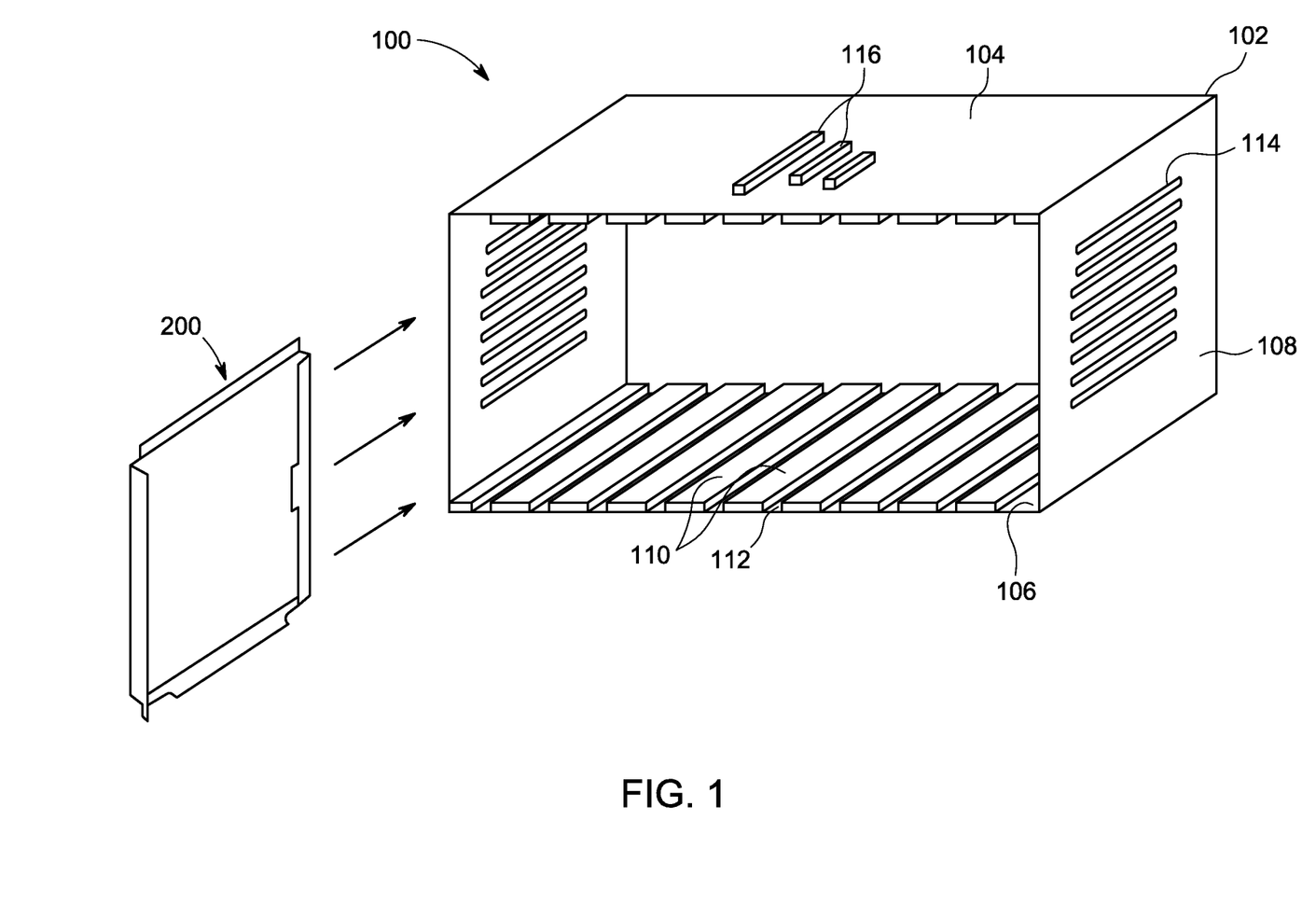
FIG. 1 is a perspective view of a chassis.

FIG. 1 is a perspective view of a chassis 100. In the exemplary embodiment, chassis 100 has a housing 102 including a top wall 104, a bottom wall 106, and a pair of side walls 108. Each of top wall 104 and bottom wall 106 has a plurality of spaced-apart rails 110 with a slot 112 being defined between adjacent rails 110. Each slot 112 of top wall 104 is aligned with a corresponding slot 112 of bottom wall 106 so as to receive a circuit card assembly (CCA) 200 in a slidable manner for retaining circuit card assembly 200 within housing 102 as set forth in more detail below. In one embodiment, housing 102 may have an open front and an open back that permit air to flow through housing 102 and over circuit card assembly 200. In another embodiment, however, housing 102 may include a front wall and a back wall for completely enclosing circuit card assembly 200 such that air is not permitted to flow into, or out of, housing 102 when circuit card assembly 200 is mounted on housing 102. Optionally, housing 102 may also include a vent 114 to facilitate airflow into, and out of, housing 102, and/or housing 102 may include a plurality of external fins 116 to facilitate convective heat transfer from housing 102 to air flowing over an exterior of housing 102 so as to facilitate dissipating heat from circuit card assembly 200 as set forth in more detail below.

Figure 2:
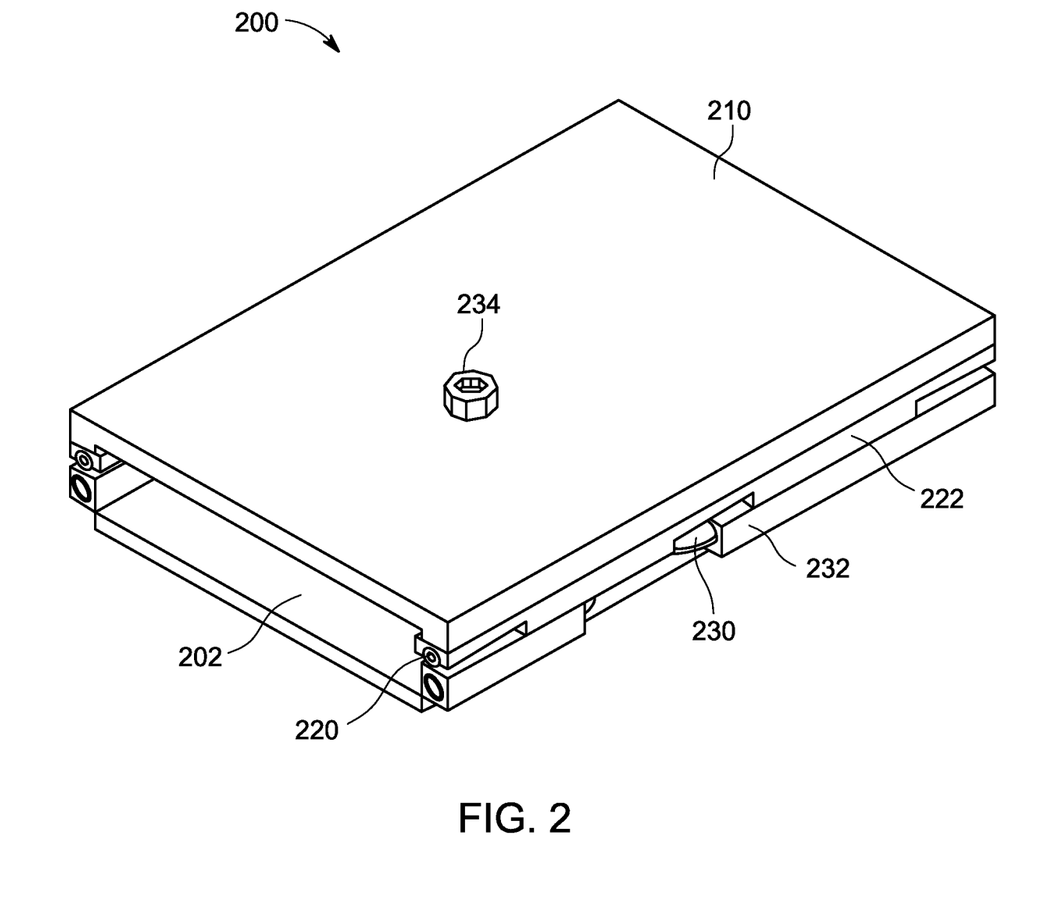
FIG. 2 is a perspective view of a circuit card assembly to be mounted on the chassis shown in FIG. 1.
Figure 3:
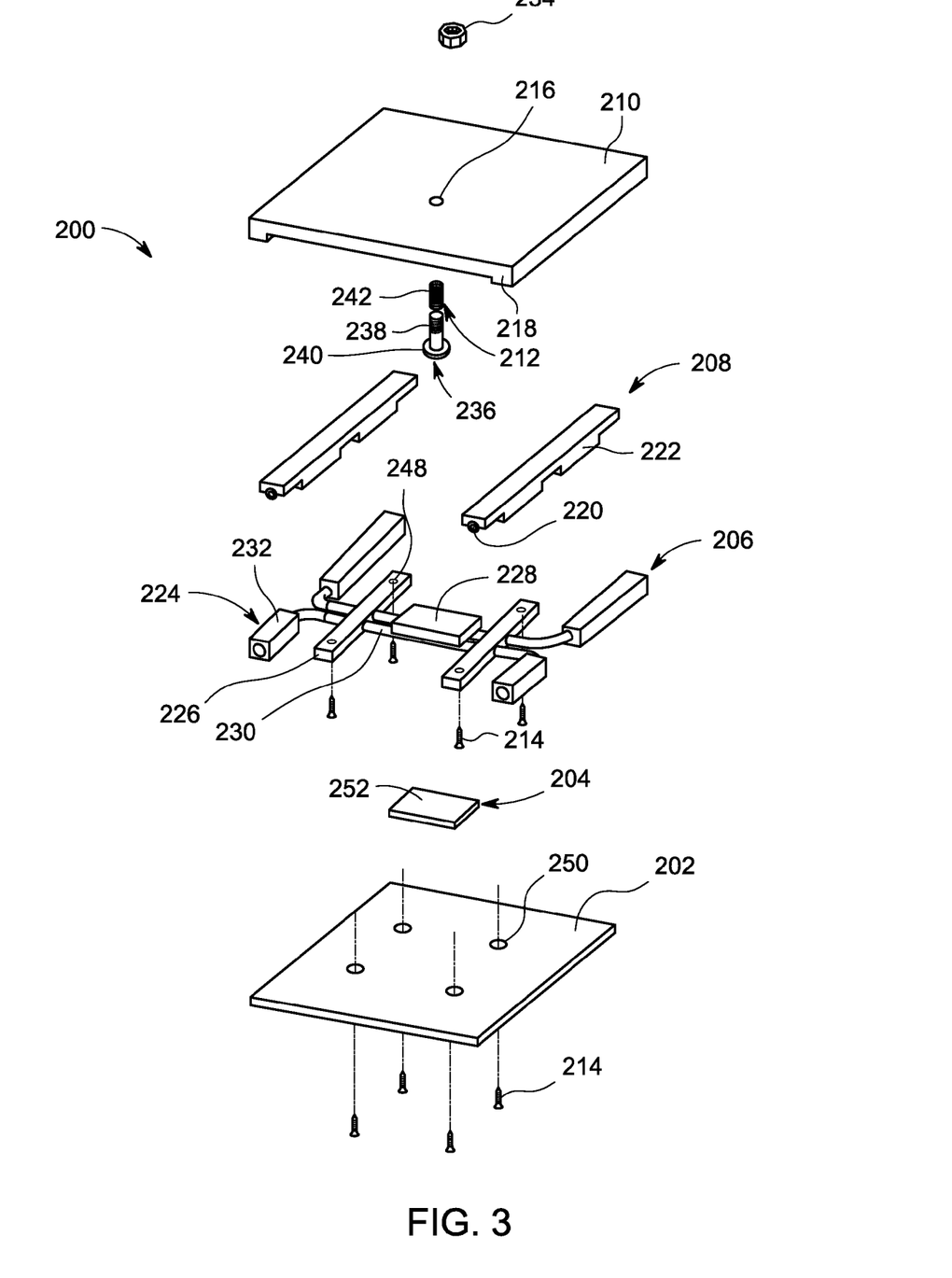
FIG. 3 is an exploded view of the circuit card assembly shown in FIG. 2.

FIGS. 2 and 3 are perspective and exploded views, respectively, of circuit card assembly 200. In the exemplary embodiment, circuit card assembly 200 includes a printed circuit board (PCB) 202, a component layup 204, a heat transfer device 206, a pair of wedge lock mechanisms 208, a frame 210, a brace 212, and a plurality of fasteners 214, e.g., screws. Frame 210 is a plate-like member having a through-hole 216 and a pair of thickened shoulders 218 forming a generally U-shape. Moreover, each wedge lock mechanism 208 includes a rotatable, cam-like core 220 surrounded by an arrangement of follower members 222 such that, upon rotation of core 220, follower members 222 separate from one another to expand the size of wedge lock mechanism 208.

In the exemplary embodiment, heat transfer device 206 includes a plurality of heat pipes 224, a pair of support members 226, and a contact member 228. Support members 226 are generally block-shaped, and contact member 228 is generally plate-shaped. Heat pipes 224 extend through support members 226 such that a portion of each heat pipe 224 is embedded in each support member 226, and contact member 228 is seated on heat pipes 224 between support members 226. Optionally, contact member 228 may have a groove sized to receive each heat pipe 224, and support members 226 and/or contact member 228 may be bonded to heat pipes 224 using a bonding agent such as, for example, an adhesive or solder. In some embodiments, rather than being seated on heat pipes 224, contact member 228 may be a block-like structure (or spreader) in which heat pipes 224 are embedded. Additionally, in other embodiments, support members 226 may be formed integrally together with frame 210, rather than being formed separately from, and fastened to, frame 210 as set forth below.

In the exemplary embodiment, each heat pipe 224 has a body 230 and a condenser 232 enveloping a segment of body 230. Body 230 is a sealed, two-phase, capillary tube that is hollow and contains a working liquid that permeates a lengthwise extending membrane 254 (shown in FIG. 5). Body 230 is fabricated from an annealed copper material so as to render it flexible, and condenser 232 may be fabricated from an aluminum material or a copper material. Alternatively, body 230 and condenser 232 may be fabricated from any suitable materials that facilitate enabling heat pipe 224 to function as described herein. In the exemplary embodiment, body 230 is generally cylindrical, and condenser 232 is substantially block-shaped, i.e., has a substantially polygonal cross-sectional profile. In other embodiments, however, body 230 and condenser 232 may have any suitable cross-sectional profiles. Optionally, condenser 232 may be bonded to body 230 using a bonding agent such as, for example, an adhesive or solder. Moreover, the working liquid may be any suitable liquid that facilitates enabling heat pipes 224 to function as described herein, such as, for example, a butane liquid or an ammonia liquid. Notably, the size of each heat pipe 224 and the quantity/arrangement of heat pipes 224 in heat transfer device 206 may be selected to suit the desired heat transfer properties of heat transfer device 206, the heat output of the heat source for which cooling is desired, and the size of the space in which heat pipes 224 are to be disposed. In other embodiments, heat pipes 224 may not be sealed, two-phase, capillary tubes but, rather, may be any structures suitable for flexing and moving heat as described herein such as, for example, graphite rods.

Figure 4:
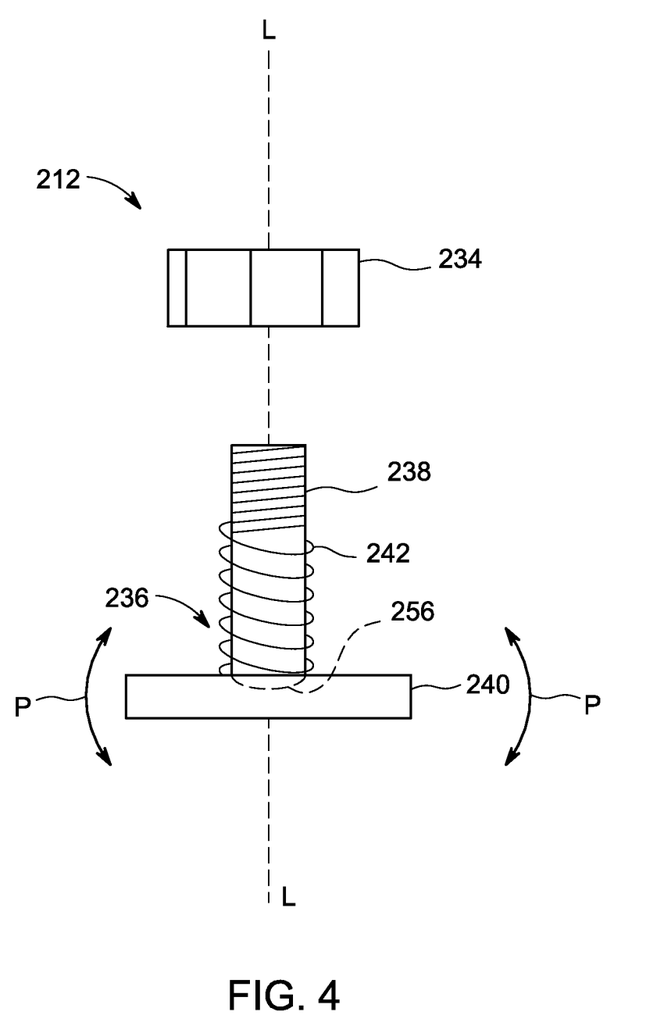
FIG. 4 is a partially exploded view of a brace of the circuit card assembly shown in FIG. 3.

FIG. 4. is a side view of brace 212. In the exemplary embodiment, brace 212 includes a threaded nut 234 and a bolt 236 having a threaded body 238 and a disc-like head 240. Head 240 is coupled to body such that head is pivotable relative to a longitudinal axis L of body in 360° about head 240 (as indicated by directional arrows P). In one embodiment, head 240 may be coupled to body 238 using a ball-and-socket joint 256. In other embodiments, head 240 may be coupled to body 238 in any suitable manner that facilitates enabling head 240 to pivot as described herein. Notably, brace 212 also includes a spring, e.g., a coil spring 242 spiraling about body 238. In some embodiments, brace 212 may not include a spring. In other embodiments, brace 212 may not include nut 234, body 238, or head 240 but, rather, may simply be made up entirely of a spring or an arrangement of springs that each acts on contact member 228 so as to be pivotable in the manner of flexing (or bending) to adjust the direction of the applied biasing force as set forth below. Alternatively, brace 212 may include any suitable arrangement of components that facilitates enabling brace 212 to function as described herein.

Figure 5:
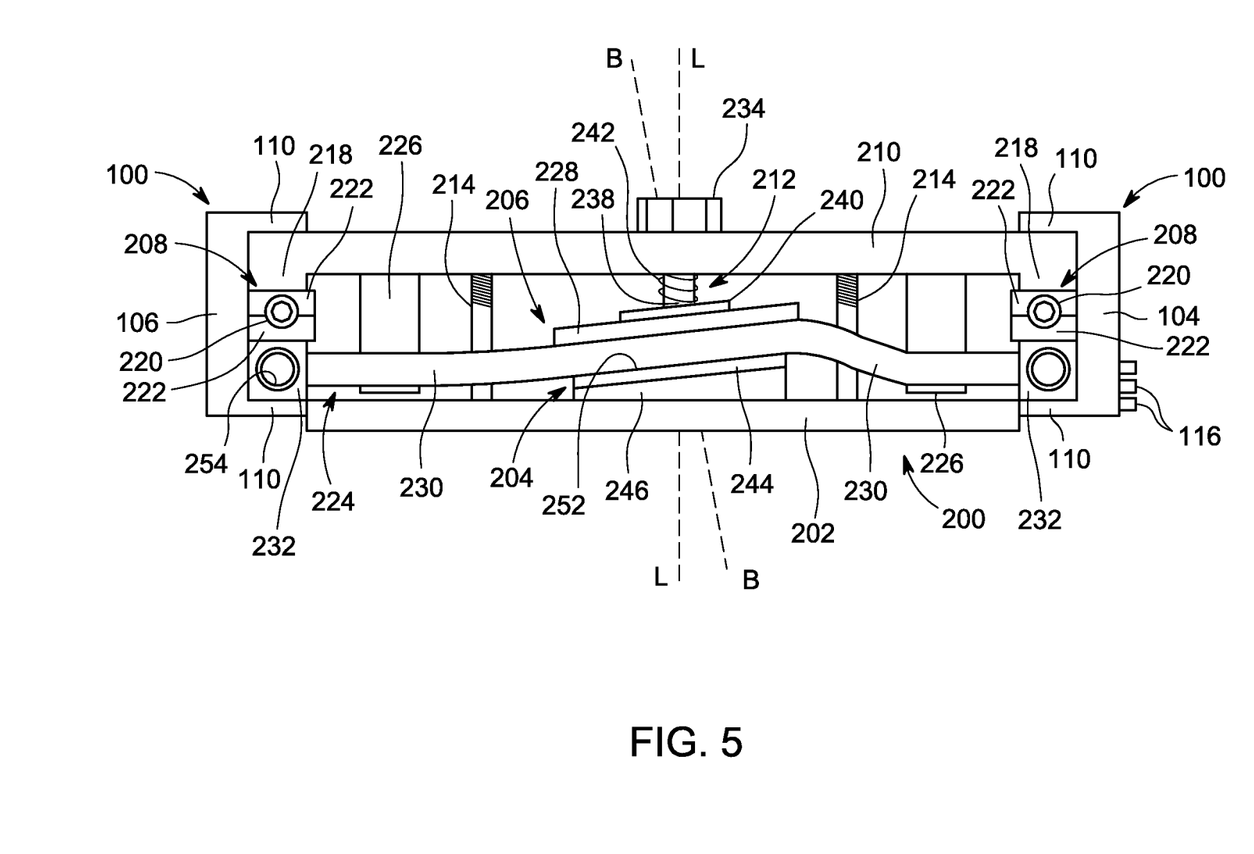
FIG. 5 is cross-sectional view of the circuit card assembly shown in FIG. 2.

FIG. 5 is a cross-sectional view of circuit card assembly 200 in an assembled configuration and mounted on chassis 100 by insertion into slot 112 defined between adjacent rails 110 of chassis 100. Prior to assembling circuit card assembly 200, component layup 204 is mounted on printed circuit board 202. Component layup 204 includes a suitable electronic component such as, for example, a processor 244 (or chip) soldered to printed circuit board 202 with at least one base component 246 such as, for example, a protective film or coating sandwiched between processor 244 and printed circuit board 202. Because processor 244 (and the various base components 246) are soldered or otherwise bonded to printed circuit board 202, it is possible that a plurality of layers of bonding material may exist between processor 244 and printed circuit board 202. Since each layer of bonding material may not have a consistent thickness throughout, the height of processor 244 relative to printed circuit board 202 may be different at one region of processor 244 than at another region of processor 244, i.e., processor 244 may not be level or, in other words, may be tilted atop of printed circuit board 202 as shown in FIG. 5. However, as set forth below, brace 212 is configured to automatically account for the tilted disposition of processor 244.

Referring to FIGS. 3 and 5, after component layup 204 has been mounted on printed circuit board 202, the remainder of circuit card assembly 200 is fabricated as follows. Brace 212 is coupled to frame 210 by inserting body 238 of bolt 236 into through-hole 216 of frame 210 for threadably coupling nut 234 to body 238 such that coil spring 242 is compressed between frame 210 and head 240. In this manner, the distance from head 240 to frame 210 and, therefore, the compression of coil spring 242 between head 240 and frame 210 is adjustable by rotating nut 234 relative to body 238. More specifically, rotating nut 234 clockwise displaces (or retracts) head 240 toward frame 210 and compresses coil spring 242, and rotating nut 234 counterclockwise displaces (or protracts) head 240 away from frame 210 and decompresses coil spring 242.

With brace 212 coupled to frame 210, heat transfer device 206 is then coupled to frame 210 by inserting fasteners 214 through apertures 248 of support members 226 for fastening to frame 210 with wedge lock mechanisms 208 positioned between shoulders 218 of frame 210 and condensers 232 of heat pipes 224 so as to retain wedge lock mechanisms 208 between shoulders 218 and condensers 232. In this manner, heat pipes 224 and contact member 228 are suspended between shoulders 218 by virtue of support members 226. Preferably, before heat transfer device 206 has been coupled to frame 210, nut 234 has already been sufficiently adjusted to maintain head 240 in spaced-apart relation with contact member 228 when heat transfer device 206 is coupled to frame 210, i.e., such that head 240 is not in contact with contact member 228 upon the coupling of heat transfer device 206 to frame 210.

After heat transfer device 206 has been coupled to frame 210, printed circuit board 202 (with component layup 204 mounted thereon) is then coupled to frame 210 by inserting fasteners 214 through apertures 250 in printed circuit board 202 for fastening to frame 210. In this manner, depending upon the height of processor 244 relative to printed circuit board 202, processor 244 may or may not contact heat pipes 224 adjacent contact member 228. More specifically, once printed circuit board 202 has been coupled to frame 210, a gap may exist between processor 244 and heat pipes 224 in some embodiments, or processor 244 may be seated against heat pipes 224 in other embodiments. However, if processor 244 is seated against heat pipes 224, the tilted (or not level) disposition of processor 244 relative to printed circuit board 202 renders the contact between processor 244 and heat pipes 224 to be non-uniform, i.e., some regions of a top surface 252 of processor 244 may be in contact with heat pipes 224 while other regions of top surface 252 may not be in contact with heat pipes 224 due to processor 244 being tilted relative to printed circuit board 202.

After printed circuit board 202 has been coupled to frame 210, nut 234 may be rotated to permit decompression of coil spring 242, thereby increasing the distance between head 240 and frame 210 until head 240 comes into contact with contact member 228 of heat transfer device 206. If a gap or non-uniform contact exists between processor 244 and heat pipes 224, head 240 displaces contact member 228 toward processor 244 and, therefore, bends the suspended segments of heat pipes 224 toward processor 244, so as to partially displace heat pipes 224 into an orientation that better conforms with the tilted orientation of processor 244. As a result of heat pipes 224 bending in conformance with the tilt of processor 244, contact member 228 tilts and head 240 pivots in a similar manner such that head 240 and contact member 228 are oriented at substantially the same angle as processor 244. In this orientation, head 240 and contact member 228 convert what was a biasing force of brace 212 along longitudinal axis L into a biasing force along a bias axis B that is substantially normal to top surface 252 of processor 244, with longitudinal axis L and bias axis B being oblique relative to one another.

In this manner, brace 212 is said to be pivotable, automatically adjusting the direction of the applied biasing force in conformance with the tilt angle of processor 244 in order to facilitate imparting the biasing force normal to top surface 252 of processor 244 even when processor 244 is tilted relative to printed circuit board 202. By automatically adjusting the direction in which the biasing force is applied, brace 212 enables heat pipes 224 to be bent into an orientation that increases the physical contact between processor 244 and heat pipes 224 to facilitate improved heat transfer between processor 244 and heat pipes 224 during operation of processor 244. Notably, in the exemplary embodiment, heat pipes 224 are in direct contact with processor 244 (without the presence of a buffer therebetween) to facilitate maximizing heat transfer. In other embodiments, however, heat pipes 224 may not be in direct contact with processor 244 but, rather, may have a spreader plate or other suitable buffer disposed between heat pipes 224 and processor 244.

Once brace 212 has been activated to bend heat pipes 224 and increase the physical contact between heat pipes 224 and processor 244, circuit card assembly 200 is said to be completely fabricated. Circuit card assembly 200 may then be inserted into slot 112 of chassis 100 between rails 110 of housing 102. After insertion into slot 112, wedge lock mechanisms 208 are to be activated by rotating core 220 of each wedge lock mechanism 208, e.g., using a hex key, to drive follower members 222 of the associated wedge lock mechanism 208 away from core 220 (and one another), thereby expanding wedge lock mechanisms 208 and locking circuit card assembly 200 into slot 112. In this manner, circuit card assembly 200 is removable from chassis 100 for upgrade, repair, or replacement by rotating core 220 in the opposite direction to retract follower members 222 toward core 220 (and one another).

During operation of an electronics system such as, for example and without limitation, an avionics system of an aircraft utilizing circuit card assembly 200, processor 244 generates heat, and the heat is transferred away from processor 244 using heat pipes 224. More specifically, processor 244 heats heat pipes 224 at the location where heat pipes 224 are in physical contact with processor 244, thereby creating an evaporator region of each heat pipe 224 adjacent contact member 228. The working liquid permeating membrane 254 within heat pipes 224 in the evaporator regions vaporizes, and the vapor travels toward condenser(s) 232 in a lengthwise direction along bodies 230 of heat pipes 224. Because each condenser 232 is in contact with one wall 104, 106 and one associated rail 110 of chassis 100, each condenser 232 has a temperature that is cooler than the temperature of the vapor within body 230, thereby condensing the vapor. The condensate that results, i.e., the working liquid, is then wicked from condensers 232 toward the evaporator regions, i.e., toward processor 244, by virtue of the capillaries in membrane 254 such that the working liquid is again heated near processor 244. In this manner, each heat pipe 224 maintains a cycle of vaporizing, condensing, and wicking the working liquid to transfer heat along the length of body 230. The heat absorbed by condensers 232 is then transferred to chassis 100 by virtue of condensers 232 being in physical contact with chassis 100, and the heat absorbed by chassis 100 is transferred to the ambient air surrounding chassis 100 by convection, e.g., using fins 116. As such, the primary heat transfer path from processor 244 to chassis 100 does not pass through frame 210, which enables heat to be removed from processor 244 more effectively. It should be noted that, in alternative embodiments, printed circuit board 202 may have one or more component layup 204 on either side, such that circuit card assembly 200 has one or more heat transfer device 206, one or more frame 210, and/or one or more brace 212 associated with each side of printed circuit board 202. For example, if multiple processors 244 are mounted on a single side of printed circuit board 202, any suitable combination of one or more heat transfer devices 206, one or more frames 210, and/or one or more braces 212 may be used to cool processors 244.

The above-described embodiments facilitate providing a brace and a heat transfer device that account for manufacturing tolerances and other variables associated with fabricating a circuit card assembly. The devices, systems, and methods disclosed herein further facilitate reducing inconsistencies (such as gaps) in the contact between an electronic component of a circuit card assembly and the heat transfer device dedicated to cooling the electronic component. The devices, systems, and methods also facilitate providing a system configured to automatically adjust the contact between an electronic component disposed on a printed circuit board and a heat transfer device dedicated to cooling the electronic component. The embodiments disclosed herein further facilitate providing a cooling system having a self-adjustable brace configured to supply a biasing force that slightly deforms an annealed copper heat pipe to enable the heat pipe to make better contact with the electronic component for which the heat pipe is to provide cooling. Additionally, the embodiments facilitate reducing thermal resistance in a processor of a circuit card assembly so as to mitigate the temperature increase of the processor during operation, thereby increasing processor power. The above-described embodiments also facilitate enabling an avionics system to function more effectively in military environments having extreme temperature gradients and high shock/vibration, thereby improving the reliability of the avionics system.

Exemplary embodiments of circuit card assemblies and methods of fabricating the same are described above in detail. The systems and methods are not limited to the specific embodiments described herein, but rather, components of the systems and/or steps of the methods may be utilized independently and separately from other components and/or steps described herein. For example, the methods may also be used in combination with other systems, and are not limited to practice with only the aircraft-related systems described herein. Rather, the embodiments may be implemented and utilized in connection with many other applications outside of aviation.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A circuit card assembly comprising:
    a printed circuit board;
    at least one electronic component mounted on said printed circuit board;
    a frame coupled to said printed circuit board such that said electronic component is disposed between said printed circuit board and said frame;
    a heat transfer device coupled to said frame, wherein said heat transfer device comprises a heat pipe disposed at least in part between said frame and said printed circuit board;
    a pivotable brace biasing said heat pipe toward said electronic component to facilitate cooling said electronic component; and
    wherein said heat pipe comprises a body and a condenser enveloping a segment of said body.

2. The circuit card assembly in accordance with claim 1, wherein said brace is a spring.

3. The circuit card assembly in accordance with claim 1, wherein said brace comprises a body and a head pivotably coupled to said body.

4. The circuit card assembly in accordance with claim 3, wherein said body has a longitudinal axis, and said head is pivotable relative to the longitudinal axis in 360° about said head.

5. The circuit card assembly in accordance with claim 4, wherein said head is pivotably coupled to said body using a ball-and-socket joint.

6. The circuit card assembly in accordance with claim 3, wherein said brace comprises a coil spring.

7. The circuit card assembly in accordance with claim 6, wherein said coil spring spirals about said body.

8. The circuit card assembly in accordance with claim 7, wherein said brace comprises a nut threadably coupled to said body such that rotating said nut relative to said body adjusts a compression of said coil spring.

9. A method of fabricating a circuit card assembly, said method comprising:
    providing a printed circuit board having at least one electronic component mounted on the printed circuit board;
    the printed circuit board to a frame such that the electronic component is disposed between the printed circuit board and the frame;
    coupling a heat transfer device to the frame such that a heat pipe of the heat transfer device is disposed at least in part between the frame and the printed circuit board;
    biasing the heat pipe toward the electronic component using a pivotable brace to facilitate cooling the electronic component; and
    providing the heat pipe with a body and a condenser enveloping a segment of the body.

10. The method in accordance with claim 9, further comprising biasing the heat pipe into direct contact with the electronic component, wherein the electronic component is a processor.

11. The method in accordance with claim 9, further comprising positioning a wedge lock mechanism between the condenser and the frame.

12. The method in accordance with claim 9, further comprising providing the heat transfer device with a contact member seated on the heat pipe such that the brace imparts a biasing force to the contact member to bias the heat pipe toward the electronic component.

13. An electronics system comprising:
a chassis; and
a circuit card assembly mounted on said chassis, said circuit card assembly comprises:
a printed circuit board;
at least one electronic component mounted on said printed circuit board;
a frame coupled to said printed circuit board such that said electronic component is disposed between said printed circuit board and said frame;
a heat transfer device coupled to said frame, wherein said heat transfer device comprises a heat pipe disposed at least in part between said frame and said printed circuit board;
a pivotable brace biasing said heat pipe toward said electronic component to facilitate cooling said electronic component by transferring heat generated by said electronic component to said chassis using said heat pipe; and wherein said heat pipe comprises a body and a condenser enveloping a segment of said body.

14. The electronics system in accordance with claim 13, wherein said electronic component is a processor and said heat pipe is in direct contact with said processor.

15. The electronics system in accordance with claim 13, further comprising a wedge lock mechanism disposed between said condenser and said frame to facilitate coupling said circuit card assembly to chassis.

16. The electronics system in accordance with claim 13, wherein said brace comprises a body and a head pivotably coupled to said body.

17. The electronics system in accordance with claim 13, wherein said brace comprises a spring.

18. The electronics system in accordance with claim 13, wherein said heat transfer device comprises a contact member seated on said heat pipe, and wherein said brace imparts a biasing force to said contact member to bias said heat pipe toward said electronic component.

* * * * *